(12) United States Patent
Min et al.

(10) Patent No.: US 9,130,132 B2
(45) Date of Patent: Sep. 8, 2015

(54) PACKAGE FOR LIGHT-EMITTING DEVICE

(71) Applicant: LIGHTIZER KOREA CO., Kangnam-ku (KR)

(72) Inventors: Jae Sik Min, Anyang (KR); Jae Young Jang, Anyang (KR); Byoung Gu Cho, Anyang (KR)

(73) Assignee: Lightizer Korea Co., Seoul (KR)

( * ) Notice: Subject to any disclaimer, the term of this patent is extended or adjusted under 35 U.S.C. 154(b) by 0 days.

(21) Appl. No.: 14/013,426

(22) Filed: Aug. 29, 2013

(65) Prior Publication Data

US 2014/0084321 A1 Mar. 27, 2014

(30) Foreign Application Priority Data

Sep. 24, 2012 (KR) .......................... 10-2012-0105752

(51) Int. Cl.
*H01L 33/00* (2010.01)
*H01L 33/50* (2010.01)

(52) U.S. Cl.
CPC ............ *H01L 33/507* (2013.01); *H01L 33/505* (2013.01); *H01L 33/502* (2013.01)

(58) Field of Classification Search
USPC ............... 257/90, 91, 93, 95, 96, 98, 99, 100, 257/745, 763, 766, 774, E33.057, E33.058, 257/E33.059, E33.069; 438/27–29, 35, 41, 438/47, 605, 608, 609, 656
See application file for complete search history.

(56) References Cited

U.S. PATENT DOCUMENTS

| | | | | |
|---|---|---|---|---|
| 6,417,019 | B1* | 7/2002 | Mueller et al. | 438/29 |
| 7,675,075 | B2* | 3/2010 | Nagai | 257/90 |
| 2006/0094137 | A1* | 5/2006 | Yan | 438/21 |
| 2009/0039369 | A1* | 2/2009 | Niino et al. | 257/98 |
| 2010/0112734 | A1* | 5/2010 | Koizumi et al. | 438/27 |
| 2012/0241784 | A1* | 9/2012 | Tang et al. | 257/98 |
| 2013/0183777 | A1* | 7/2013 | Lim | 438/27 |
| 2013/0214298 | A1* | 8/2013 | Lin et al. | 257/88 |

FOREIGN PATENT DOCUMENTS

| | | |
|---|---|---|
| KR | 2004042350000 | 12/2005 |
| KR | 1020080070193 | 7/2008 |
| KR | 1020090073727 | 2/2010 |
| KR | 1020110119909 | 5/2013 |
| KR | 1020120105752 | 2/2014 |

\* cited by examiner

*Primary Examiner* — Sonya D McCall Shepard
(74) *Attorney, Agent, or Firm* — Hunter E. Webb; Keohane & D'Alessandro, PLLC

(57) ABSTRACT

The present invention provides a package for a light-emitting device, including the light-emitting device configured to provide light having a specific wavelength region, electrode pads formed on the light-emitting device, and a phosphor layer formed over the light-emitting device other than regions where the electrode pads are formed and configured to convert the light of the light-emitting device into white light by changing the wavelength of the light provided by the light-emitting device, wherein the phosphor layer is formed in a conformable thickness and is formed in a region wider than an upper region of the light-emitting device other than the regions where the electrode pads are formed.

8 Claims, 5 Drawing Sheets

PACKAGE FOR LIGHT-EMITTING DEVICE

CROSS REFERENCE TO RELATED APPLICATION

This application claims the benefit of Korean Patent Application No. 10-2012-0105752 filed on Sep. 24, 2012, which is hereby incorporated by reference in its entirety into this application.

BACKGROUND OF THE INVENTION

1. Technical Field

The present invention relates to a package for a light-emitting device and, more particularly, to a package for a light-emitting device which provides white light by changing a wavelength of light emitted from the light-emitting device.

2. Description of the Related Art

Recently, a light-emitting device in which Al or In is added to GaN has been in the spotlight owing to a long lifespan, low power consumption, excellent brightness, and an eco-friendly element not harmful to the human body as compared with a conventional incandescent. In particular, a light-emitting device providing white light has been further in the spotlight.

The light-emitting device is being used in a vehicle illumination, a traffic signal lamp, and the Back Light Unit (BLU) of a liquid crystal display owing to the above-described advantages.

MacAdam's ellipse rule has recently been proposed as an index for evaluating whether a color coordinate measured at an artificial light source is identical with a color coordinate when being seen by an eye of a human being. MacAdam's ellipse rule provides a four-step criterion. Currently, in the United States, an artificial light source that does not comply with three steps of MacAdam's ellipse rule is not allowed to be sold. In order to satisfy the three steps of MacAdam's ellipse rule, it is very important to reduce a color variance in white light.

Meanwhile, Korean Patent Laid-Open Publication No. 10-2008-0070193 discloses a phosphor light emitting diode and a method for manufacturing the same. However, the invention disclosed in the Korean Patent Laid-Open Publication is problematic in that a phosphor film is deteriorated because the phosphor film is attached by a thermal printing process. It has been known that this problem has a great defect in reliability that is most important in a white light light-emitting device. Furthermore, there is a problem in that a light source phenomenon in which light emitted from the light-emitting device leaks because the phosphor film is attached to some regions of the light emission surface.

SUMMARY OF THE INVENTION

Accordingly, the present invention has been made keeping in mind the above problems occurring in the prior art, and an object of the present invention is to provide a package for a light-emitting device, which is capable of effectively suppressing the deterioration of a phosphor layer, preventing a light source phenomenon in which light emitted from the light-emitting device leaks, and reducing a color variance in white light.

Another object of the present invention is to provide a package for a light-emitting device in which a crack is not generated in a phosphor layer when the phosphor layer is attached to the light-emitting device and the phosphor layers can be arranged effectively.

Yet another object of the present invention is to provide a method of manufacturing a semiconductor light-emitting diode which is capable of manufacturing the semiconductor light-emitting diode.

Technical objects to be achieved by the present invention are not limited to the above-described objects and other technical objects that have not been described will be evidently understood by those skilled in the art from the following description.

In order to accomplish the above objects, the present invention provides a package for a light-emitting device, including the light-emitting device configured to provide light having a specific wavelength region, electrode pads formed on the light-emitting device, and a phosphor layer formed over the light-emitting device other than regions where the electrode pads are formed and configured to convert the light of the light-emitting device into white light by changing the wavelength of the light provided by the light-emitting device, wherein the phosphor layer is formed in a conformable thickness and is formed in a region wider than an upper region of the light-emitting device other than the regions where the electrode pads are formed.

In the package in accordance with an embodiment of the present invention, the phosphor layer may have hardness (Durometer Shore D) of 25 to 75.

In the package in accordance with an embodiment of the present invention, the phosphor layer may be made of a fluorescent material, i.e. a mixture of phosphor, silicon, and a hardner and the hardness of the phosphor layer may be controlled by changing an addition ratio (wt %) of the hardner.

The package in accordance with an embodiment of the present invention may further include a heat-blocking layer configured to suppress a transfer of heat from the light-emitting device to the phosphor layer between the light-emitting device and the phosphor layer.

In the package in accordance with an embodiment of the present invention, the heat-blocking layer may be made of transparent silicon.

DETAILED DESCRIPTION

Exemplary embodiments of the present invention are described in detail with reference to the accompanying drawings.

Figure 1:
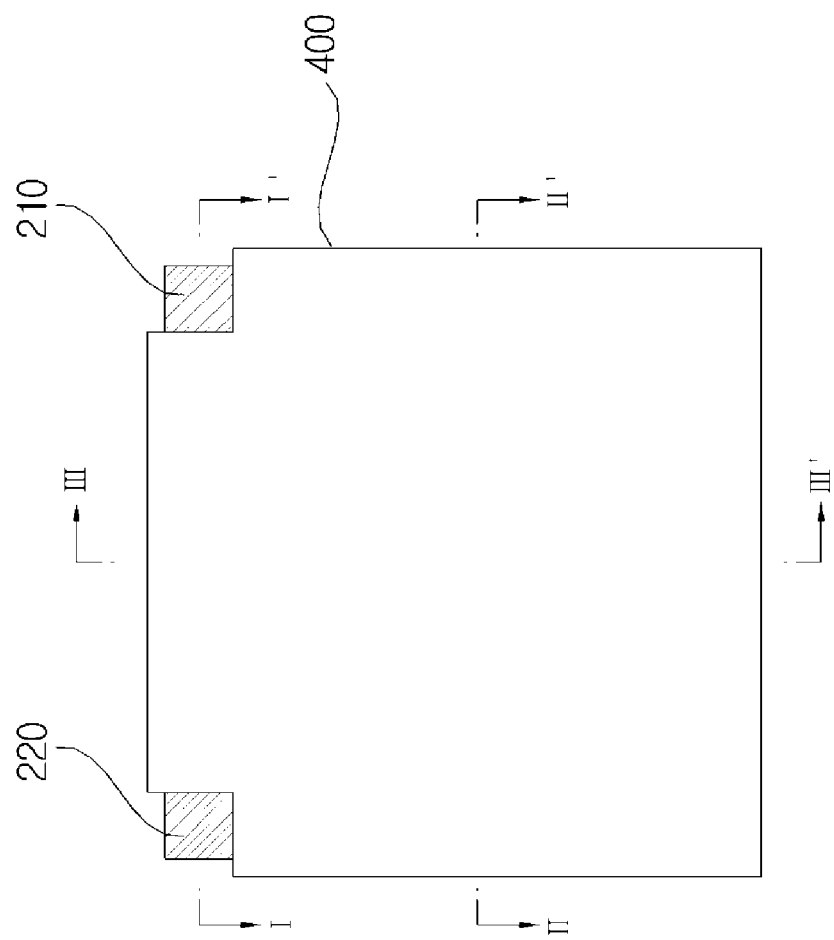
FIG. 1 is a plan view of a package for a light-emitting device in accordance with an embodiment of the present invention.
Figure 2:
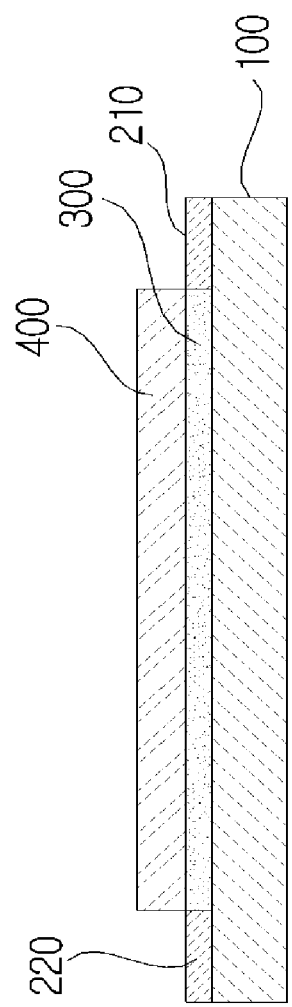
FIG. 2 is a cross-sectional view of the package for a light-emitting device taken along line I-I' of FIG. 1.

A package for a light-emitting device in accordance with an embodiment of the present invention can include a light-emitting device 100, electrode pads 210 and 220, a phosphor layer 400, and a heat-blocking layer 300, as shown in FIGS. 1 and 2.

The light-emitting device 100 provides light having a specific wavelength region. More particularly, the light-emitting device 100 can be a light-emitting diode providing light of a blue wavelength or a light-emitting diode providing light of an ultraviolet wavelength.

The electrode pads 210 and 220 made of metal material are formed on the light-emitting device 100 and are configured to transfer an electrical signal to the light-emitting device 100.

Figure 3:
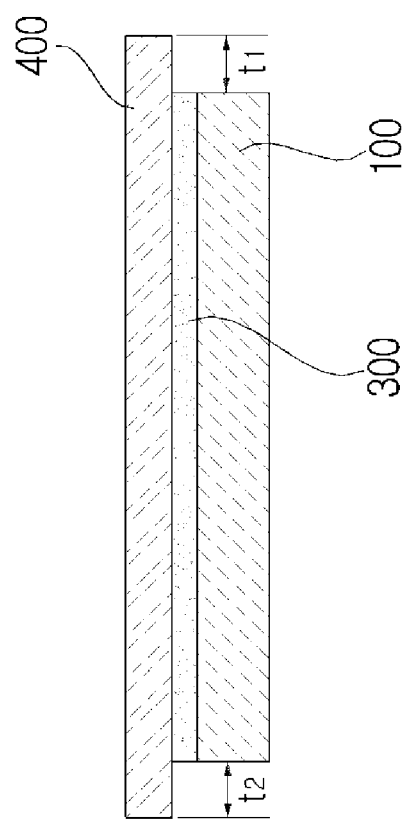
FIG. 3 is a cross-sectional view of the package for a light-emitting device taken along line II-II' of FIG. 1.
Figure 4:
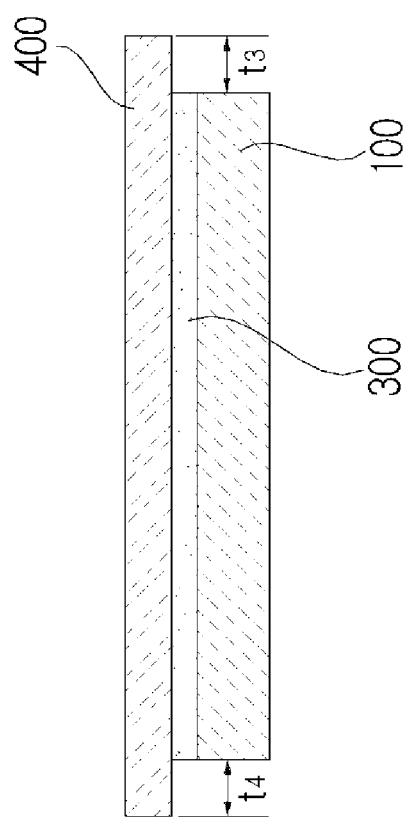
FIG. 4 is a cross-sectional view of the package for a light-emitting device taken along line III-III' of FIG. 1.

Furthermore, as shown in FIGS. 1, 3, and 4, the phosphor layer 400 is formed over the light-emitting device 100 other than regions where the electrode pads 210 and 220 are formed, and is configured to convert light generated from the light-emitting device 100 into white light by changing a wavelength of light emitted from the light-emitting device 100.

Here, the phosphor layer 400 has a uniform thickness, and the phosphor layer 400 is formed in a region wider than an upper region of the light-emitting device 100 other than regions where the electrode pads 210 and 220 are formed, as shown in FIGS. 3 and 4.

Each of intervals t1, t2, t3, and t4 at the edges of the phosphor layer 400 and the edges of the light-emitting device 100 can be 10 μm to 1000 μm. If each of the intervals t1, t2, t3, and t4 at the edges of the phosphor layer 400 and the edges of the light-emitting device 100 is too short, a light source phenomenon in which light emitted from the light-emitting device 100 leaks cannot be suppressed effectively. If each of the intervals t1, t2, t3, and t4 at the edges of the phosphor layer 400 and the edges of the light-emitting device 100 is too long, the phosphor layers 400 may not be effectively arranged over the light-emitting device 100.

The package for a light-emitting device in accordance with an embodiment of the present invention can fundamentally prevent a light source phenomenon in which light emitted from the light-emitting device 100 leaks because the phosphor layer 400 is formed in a region wider than the upper region of the light-emitting device 100 other than the regions where the electrode pads 210 and 220 are formed.

Furthermore, the package for a light-emitting device in accordance with an embodiment of the present invention can effectively reduce a color variance in white light that is provided by the package for a light-emitting device because the phosphor layers 400 have a conformable thickness.

Meanwhile, the hardness (Durometer Shore D) of the phosphor layer 400 is about 25 to 75. More particularly, the phosphor layer 400 having this hardness is made of a mixture of a phosphor, silicon, and a hardner, and the hardness of the phosphor layer 400 is determined by an addition ratio (wt %) of the hardner. A range of the proposed phosphor layer 400 was calculated by the inventor of the present invention by way of experiments. If the hardness is less than 25, there is a difficulty in a phosphor manufacturing process because the hardness is too small. If the hardness is greater than 75, a crack is generated in the phosphor because the hardness is too great, thus having an adverse effect on the quality and reliability of the light-emitting device 100. The hardness of the phosphor layer 400 is controlled by first selecting a silicon material according to a hardness range of the silicon and adjusting the amount of a mixture of the phosphor within the silicon. The hardness increases according to an increase in the amount of the hardener. Table 1 shows process characteristics according to the hardness (Durometer Shore D) of the phosphor according to the present invention.

TABLE 1

| Hardness (shore D) | 10 | 25 | 50 | 75 | 90 |
|---|---|---|---|---|---|
| Type of silicon material | | | A | | |
| Type of phosphor material | | | a | | |
| Hardner addition ratio (wt %) | 0.5 | 1.0 | 2.0 | 3.0 | 3.5 |
| Mixture Ratio of silicon:phosphor | 1:1 | 1:1 | 1:1 | 1:1 | 1:1 |
| Process easiness (%) | 5 | 70 | 90 | 65 | 10 |
| Ratio of generated cracks (%) | 0 | 0 | 0 | 5 | 50 |
| Thickness uniformity (μm) | <50 μm | <10 μm | <10 μm | <5 μm | <5 μm |
| Bending (%) | 50 | 5 | 0 | 0 | 0 |
| Process yield (%) | 15 | 85 | 95 | 80 | 5 |

Figure 5:
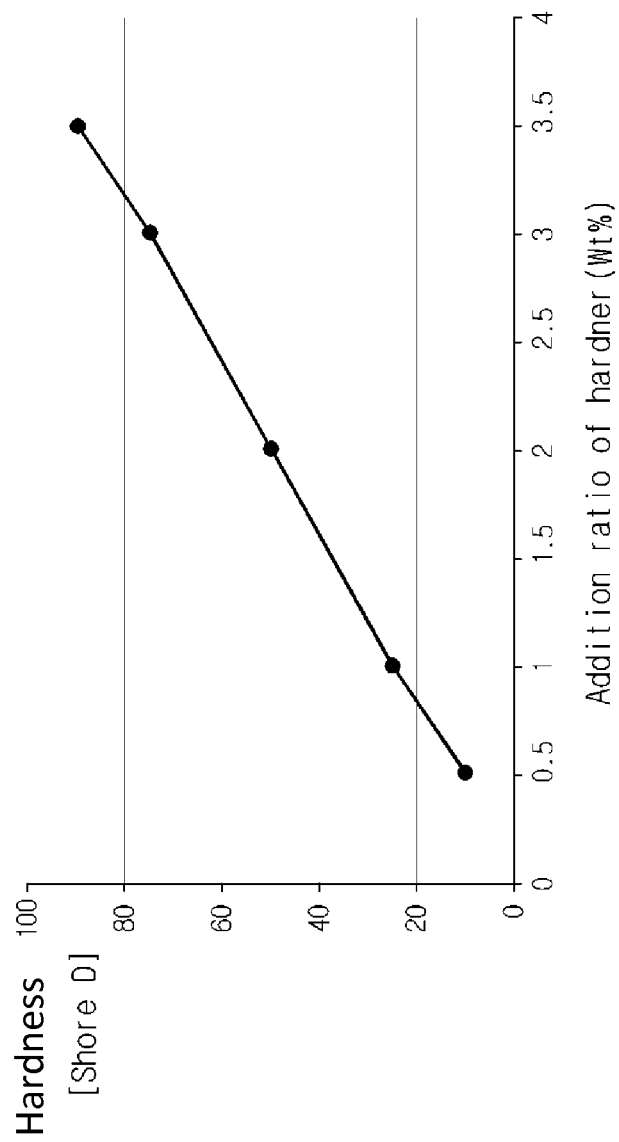
FIG. 5 is a graph showing a relationship between the hardness of a phosphor layer and a hardner addition ratio.

From Table 1, it can be seen that the hardness of the phosphor layer 400 is 10 to 90. Silicon used in the experiments is a material used to convert white light of an LED. The phosphor inputted to the silicon is made of a yellow-series material used to convert a wavelength of light into a wavelength of white light in an LED. The phosphor layer 400 is formed by a mixture of the phosphor and the silicon. In hardness dependency evaluation, all samples were experimented in the state in which a mixture ratio of the phosphor and the silicon is 1:1. The hardness of the phosphor layer 400 is changed depending on a hardner. A hardner used in the experiments has a silica ($SiO_2$) particle and has a diameter of approximately 1 μm or less. The amount of the inputted hardner ranges from 0.5 wt % to 3.5 wt % based on a weight ratio. As the amount of the hardner increases, the hardness of the phosphor layer 400 tends to increase directly. FIG. 5 shows a relationship between the hardness of the phosphor layer 400 and an addition ratio of the hardner.

In terms of process ease, the best characteristics were achieved when the hardness was 50. It can be seen that when the hardness is 25 or lower or 75 or higher, process ease suddenly decreases. This is because if the phosphor layer 400 becomes soft or hard, there is a difficulty in forming the shape of the phosphor layer 400 having a molding form. In terms of the ratio of generated cracks, it can be seen that when the hardness is 75 or higher, about 50% of cracks are generated because the hardness rises. Accordingly, the hardness of the phosphor layer 400 has to be limited to a maximum of 75 or less. In terms of the thickness regularity of the phosphor layer 400, it shows that it is easy to secure a uniform thickness according to an increase in the hardness of the phosphor layer 400. This is because the molding of the phosphor layer 400 is not easy if the phosphor layer 400 is made of soft material due to low hardness. The bending characteristic of the phosphor layer 400 has a similar tendency to the thickness uniformity of the phosphor layer 400. It shows that a process may not be easily applied to the phosphor layer 400 having hardness of 25 or lower. The process yield is represented as a comprehensive process yield in which the aforementioned process ease, the ratio of generated cracks, the thickness regularity, and the bending characteristic are combined. It can be seen that the hardness of the phosphor layer 400 is limited to 25 or higher to 75 or lower on the basis of the process yield of at least 80% or higher.

In the package for a light-emitting device in accordance with an embodiment of the present invention, the phosphor layer 400 is formed in the state in which the hardness (Durometer Shore D) of the phosphor layer 400 ranges from 25 to 75. Accordingly, a crack is not generated in the phosphor layer 400 when the phosphor layer 400 is attached to the light-emitting device 100, and the phosphor layers 400 can be arranged effectively.

Furthermore, the heat-blocking layer 300 prohibits heat, generated from the light-emitting device 100 between the light-emitting device 100 and the phosphor layer 400, from being transferred to the phosphor layer 400. More particularly, the heat-blocking layer 300 can be made of transparent silicon.

In the package for a light-emitting device in accordance with an embodiment of the present invention, since the heat-blocking layer 300 made of transparent silicon is included, the phosphor layer 400 is attached to the light-emitting device 100 more firmly, and the deterioration of the phosphor layer 400 can be effectively suppressed with no need to use a thermal printing process.

As described above, the package for a light-emitting device in accordance with the embodiments of the present invention can effectively suppress the deterioration of the phosphor layer due to heat because the phosphor layer is not attached by a thermal printing process.

Furthermore, the package for a light-emitting device in accordance with the embodiments of the present invention can fundamentally prevent a light source phenomenon in which light emitted from the light-emitting device leaks because the phosphor layer is formed in a region wider than the upper region of the light-emitting device other than regions where the electrode pads are formed.

Furthermore, the package for a light-emitting device in accordance with the embodiments of the present invention can effectively reduce a color variance in white light that is provided by the package for a light-emitting device because the phosphor layers have a conformable thickness.

Furthermore, in the package for a light-emitting device in accordance with the embodiments of the present invention, since the hardness (Durometer Shore D) of the phosphor layer ranges from 25 to 75, a crack is not generated in the phosphor layer when the phosphor layer is attached to the light-emitting device and the phosphor layers can be arranged effectively.

Furthermore, the package for a light-emitting device in accordance with the embodiments of the present invention can effectively block the transfer of heat from the light-emitting device to the phosphor layer because the heat-blocking layer is further included.

Furthermore, the package for a light-emitting device in accordance with the embodiments of the present invention further includes the heat-blocking layer made of transparent silicon. Accordingly, the phosphor layer can be attached to the light-emitting device more firmly, and the deterioration of the phosphor layer can be effectively suppressed with no need to use a thermal printing process.

Although the present invention has been described in connection with the preferred embodiments for illustrating the principle of the present invention, the present invention is not limited to the aforementioned constitutions and actions.

A person having ordinary skill in the art will appreciate that the present invention can be changed and modified in various manners without departing from the spirit and scope of the present invention.

Accordingly, all proper changes, modifications, and equivalents should be construed as belonging to the scope of the present invention.

What is claimed is:

1. A package for a light-emitting device, comprising:
   the light-emitting device configured to provide light having a specific wavelength region;
   electrode pads formed on the light-emitting device; and
   a phosphor layer formed over the light-emitting device other than regions where the electrode pads are formed, such that the electrode pads remain exposed, and configured to convert the light of the light-emitting device into white light by changing the wavelength of the light provided by the light-emitting device, the phosphor layer being formed over only an upper region of the light-emitting device,
   wherein the phosphor layer is formed in a conformable thickness that is substantially uniform and is formed in a region wider than an upper region of the light-emitting device such that an outer edge of the phosphor layer extends outward beyond an outer edge of the light-emitting device other than in the regions where the electrode pads are formed, and
   wherein:
     the phosphor layer is made of a mixture of phosphor, a silicon, and a hardner, and
     hardness of the phosphor layer is controlled by changing an addition ratio (wt %) of the hardner;
     wherein a ratio of the phosphor to silicon is substantially 1:1.

2. The package of claim 1, wherein the phosphor layer has hardness (Durometer Shore D) of 25 to 75.

3. The package of claim 1, further comprising a heat-blocking layer having a uniform thickness and configured to suppress a transfer of heat from the light-emitting device to the phosphor layer between the light-emitting device and the phosphor layer.

4. The package of claim 1, wherein the hardener comprises $SiO_2$.

5. The package of claim 1, wherein an amount of the hardener is approximately 0.5%-3.5% by weight.

6. The package of claim 1, wherein the outer edge of the phosphor layer extends outward beyond the outer edge of the light-emitting device is in a range from 10 µm to 1000 µm.

7. The package of claim 3, wherein the heat-blocking layer is made of transparent silicon.

8. The package of claim 4, wherein the hardener has a diameter of approximately 1 micrometer or less.

* * * * *